United States Patent
Tang et al.

(10) Patent No.: US 12,205,840 B2
(45) Date of Patent: Jan. 21, 2025

(54) CALIBRATION HARDWARE FOR ION IMPLANTER

(71) Applicant: Taiwan Semiconductor Manufacturing Company, Hsinchu (TW)

(72) Inventors: Lung-Yin Tang, Keelung (TW); Tsung-Min Lin, Zhubei (TW); Hsin-Sheng Liang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 337 days.

(21) Appl. No.: 17/889,529

(22) Filed: Aug. 17, 2022

(65) Prior Publication Data
US 2024/0063045 A1  Feb. 22, 2024

(51) Int. Cl.
*H01L 21/683* (2006.01)
*H01J 37/317* (2006.01)

(52) U.S. Cl.
CPC ........ *H01L 21/683* (2013.01); *H01J 37/3171* (2013.01)

(58) Field of Classification Search
CPC ............ H01J 37/3171; H01J 2237/204; H01L 21/265; H01L 21/683
USPC ....................................................... 361/234
See application file for complete search history.

(56) References Cited

U.S. PATENT DOCUMENTS

| | | | | |
|---|---|---|---|---|
| 5,642,298 A * | 6/1997 | Mallory | .................. | H01L 22/20 414/941 |
| 6,967,497 B1 * | 11/2005 | Hembree | .......... | H01L 21/67253 324/750.02 |
| 11,584,013 B2 * | 2/2023 | Vepakomma | .......... | B25J 9/1692 |
| 11,658,001 B1 * | 5/2023 | Du | .......................... | H01J 37/20 250/492.3 |
| 2002/0088685 A1 * | 7/2002 | Novak | .................... | B23Q 16/02 198/345.3 |

FOREIGN PATENT DOCUMENTS

CN     109994415 A  *  7/2019
EP       1046881 A1 * 10/2000  ........... G01B 11/272

OTHER PUBLICATIONS

Machine translation of Chen et al. Chinese Patent Document CN 109994415 A Jul. 2019 (Year: 2019).*

* cited by examiner

*Primary Examiner* — Kevin J Comber
(74) *Attorney, Agent, or Firm* — Lippes Mathias LLP

(57) ABSTRACT

A horizontally oriented calibration jig for a wafer gripper arm of an ion implanter is disclosed. The calibration jig is mounted within the process chamber of the ion implanter. The calibration jig includes a mounting plate that spans a diameter of the wafer gripper arm, a support stand passing through the mounting plate, and a calibration plate at a bottom end of the support stand. The perimeter of the calibration plate includes a plurality of notches. The calibration plate is rotated. If any finger of the wafer gripper arm falls into a notch, the rotating calibration plate stops. The finger is then adjusted until it does not fall into a notch.

20 Claims, 14 Drawing Sheets

CALIBRATION HARDWARE FOR ION IMPLANTER

BACKGROUND

Integrated circuits are formed on a semiconductor wafer. Photolithographic patterning processes use ultraviolet light to transfer a desired mask pattern to a photoresist on a semiconductor wafer. Etching processes may then be used to transfer to the pattern to a layer below the photoresist. This process is repeated multiple times with different patterns to build different layers on the wafer substrate and make a useful device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
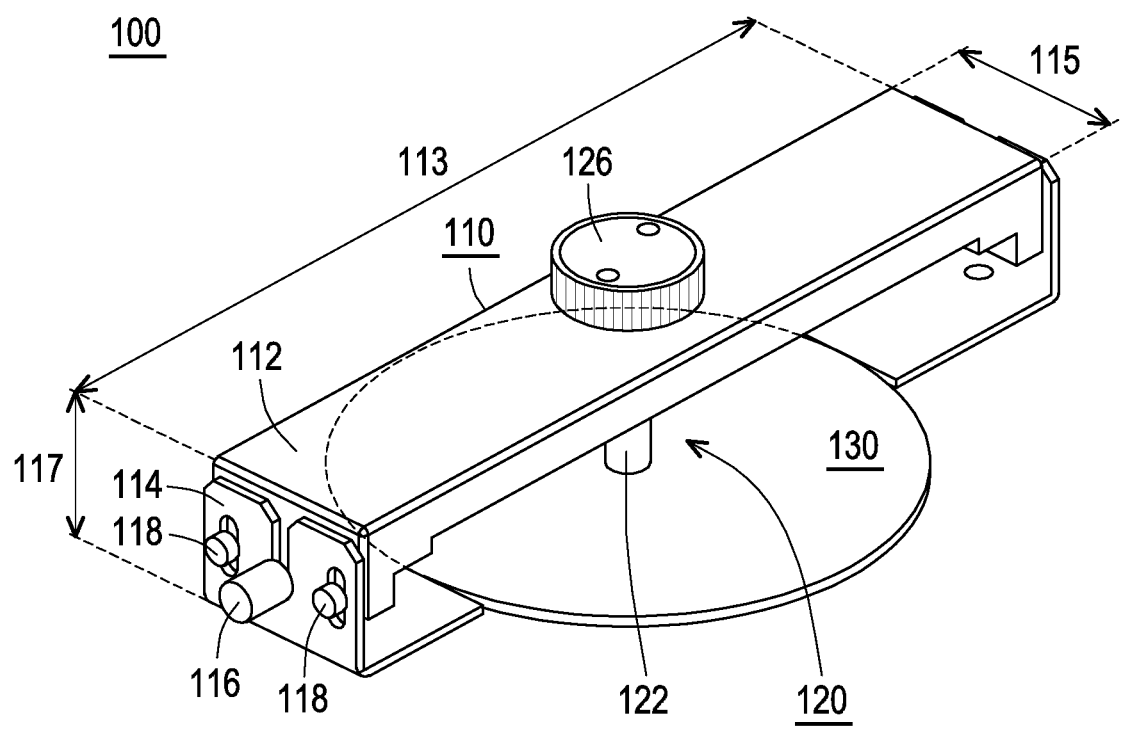
FIG. 1 is a perspective view of a first embodiment of a calibration jig, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The present disclosure relates to methods and systems for improving the calibration of wafer transfer hardware in an ion implantation device. Ion implantation is a process used in the manufacturing of semiconductor devices. Implantation of various atoms into a silicon crystal lattice modifies the conductivity of the lattice in the implanted location, permitting the manufacture of the various parts of a transistor. An ion implanter generally includes an ion source, a beam line, and a process chamber. The ion source produces ions. The beam line organizes the ions into a beam having high purity in terms of ion mass, energy, and species. The ion beam is then used to irradiate semiconducting wafer substrates in the process chamber.

Within the process chamber, a wafer gripper arm is used to transfer wafers between a load-lock chamber and a scanning wheel. The scanning wheel includes multiple paddles arranged in a circular array around a central hub. Each paddle includes a wafer mounting surface which holds a wafer. The scanning wheel rotates around the central hub at high velocity past a window through which an ion beam passes. This permits the batch of wafers mounted on the scanning wheel to be repeatedly passed through the ion beam to provide an even distribution of the ions over the wafer surfaces.

The wafer gripper arm is a critical component due to its physical contact with the wafer. After various elements are replaced or parts are changed, the wafer gripper arm needs to be calibrated. The calibration operation currently requires removal of the wafer gripper arm, and is not completely reliable. As a result, wafer quality is reduced and service downtime is increased.

Figure 2:
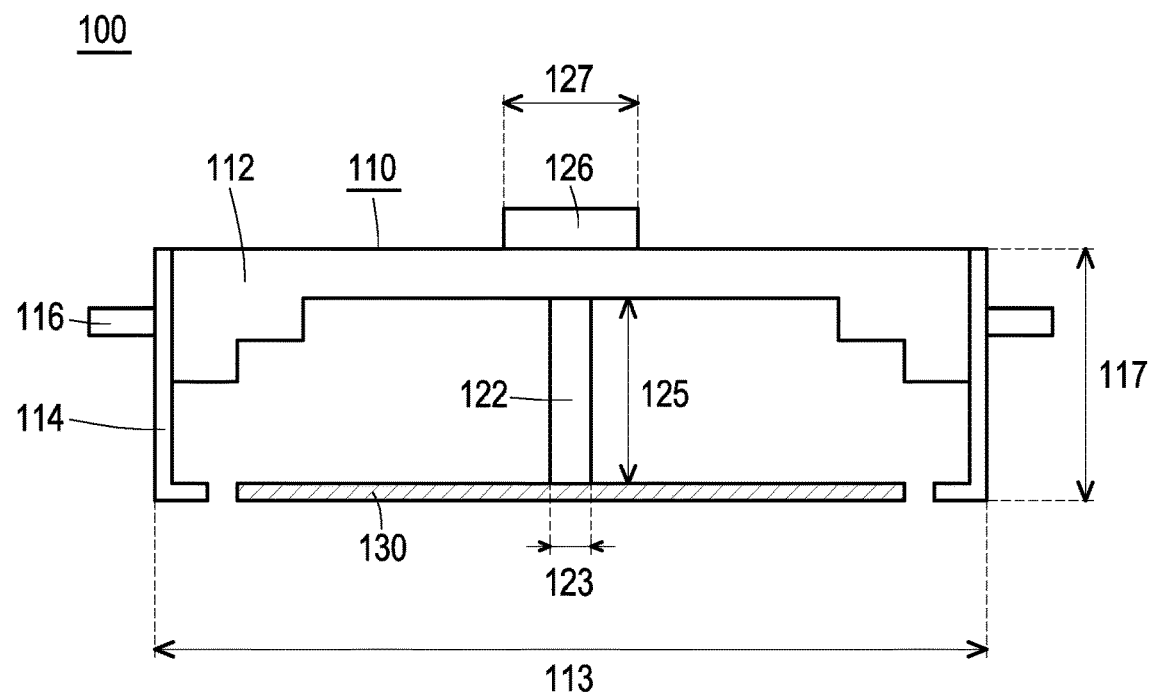
FIG. 2 is a side view of the first embodiment of a calibration jig of FIG. 1.

The present disclosure relates to a calibration jig which does not require the wafer gripper arm to be removed from the process chamber. This improves calibration accuracy and increases device uptime. FIG. 1 is a perspective view of the calibration jig 100. FIG. 2 is a side view of the calibration jig 100. Referring to both figures, the calibration jig 100 includes a mounting plate 110, a support stand 120, and a calibration plate 130.

The mounting plate includes a central beam 112 and vertical hooks 114 on each end thereof. Each vertical hook 114 is L-shaped, and the wafer gripper arm (not depicted here) is held in place between the vertical hooks 114 and the central beam 112. A peg 116 and two fasteners 118 are provided at each end of the central beam. The peg is fixed in place. When the fasteners are loosened, each vertical hook can be moved up-and-down to a desired location. When the fasteners are tightened, each vertical hook is then fixed in place on the mounting plate.

The mounting plate has a length 113, a width 115, and a height 117. The length 113 may be from about 300 millimeters (mm) to about 400 mm. The width 115 may be from about 50 mm to about 100 mm. The height 117 may be from about 30 mm to about 100 mm.

The support stand 120 passes through a hole (not visible) in the mounting plate 110 and is used to join the calibration plate 130 to the mounting plate 110. The support stand includes a shaft 122 and a knob or fastener 126. The shaft extends through and below the mounting plate 110, and the lower end of the shaft supports the calibration plate 130. The upper end of the shaft is joined to the knob, which is present upon the upper surface of the mounting plate. The shaft generally has a cylindrical shape, and can be hollow or solid. The knob can be used to rotate the support stand 120 and the calibration plate 130. The diameter 123 of the shaft 122 and the diameter 127 of the knob 126 are each from about 10 mm to about 100 mm. The diameter 123 of the shaft is less than the diameter 127 of the knob. Both diameters 123, 127, are less than the width 115 of the mounting plate. The calibration plate 130 is attached to the lower end of the shaft 122. The distance 125 between the mounting plate 110 and the calibration plate 130 is from about 30 mm to about 100 mm.

Figure 3:
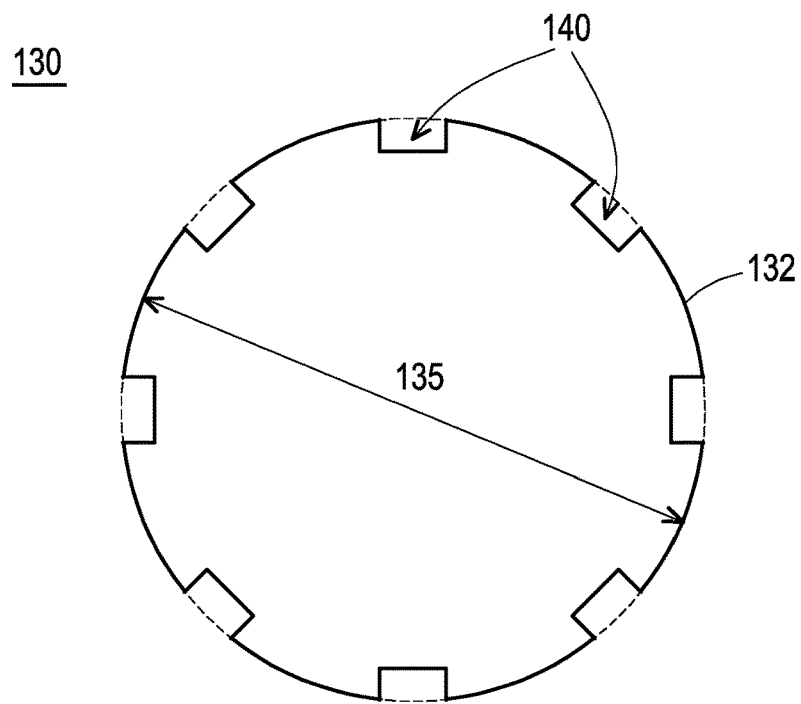
FIG. 3 is a plan view of the calibration plate of the calibration jig.

FIG. 3 is a plan view of the calibration plate 130. As illustrated here, the calibration plate is in the shape of a circle, although other shapes such as rectangular could potentially be used. One or more notches 140 are present in the perimeter 132 (dotted line) of the calibration plate 130. In particular embodiments, there are a plurality of notches (i.e. two or more) spaced evenly around the perimeter. In the illustration here, eight notches are shown. The calibration plate has a width or diameter 135 (depending on its shape) of about 150 mm to about 300 mm, which may vary to correspond to the size of the wafer that is being handled by the wafer gripper arm.

Figure 4A:
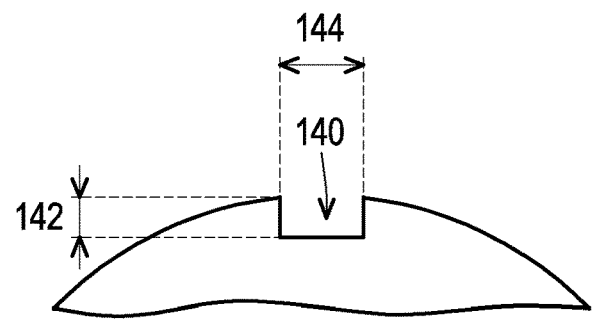
FIG. 4A shows a first embodiment of a notch in the calibration plate.
Figure 4B:
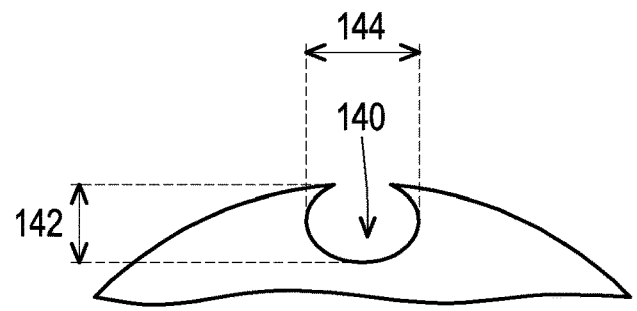
FIG. 4B shows a second embodiment of a notch in the calibration plate.
Figure 4C:
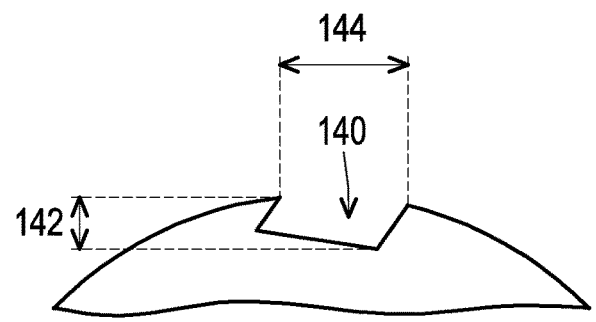
FIG. 4C shows a third embodiment of a notch in the calibration plate.

As will be seen later, the notches are shaped such that a finger of the wafer gripper arm will fall into the notch if the finger is improperly calibrated or adjusted. FIGS. 4A-4C show three different possible shapes for the notch.

In FIG. 4A, the notch 140 is rectangular, having a depth 142 and a length 144. In some embodiments, the depth may be from about 1 mm to about 2 mm. The length may be from about 2 mm to about 4 mm. it is noted that the length is measured as the size of the opening into the calibration plate. The depth is measured in terms of the distance the notch penetrates into the calibration plate perpendicular to the perimeter.

In FIG. 4B, the notch 140 has an elliptical shape. The depth 142 of the ellipse may be from about 1 mm to about 2 mm. The length 144 of the ellipse may be from about 2 mm to about 4 mm.

More generally, as seen in FIG. 4C, the notch 140 has a polygonal shape. So long as the finger of the wafer gripper arm is able to fall into the notch, the shape of the notch is not particularly significant. The depth 142 of the notch may be from about 1 mm to about 2 mm. The length 144 of the notch may be from about 2 mm to about 4 mm.

Figure 5:
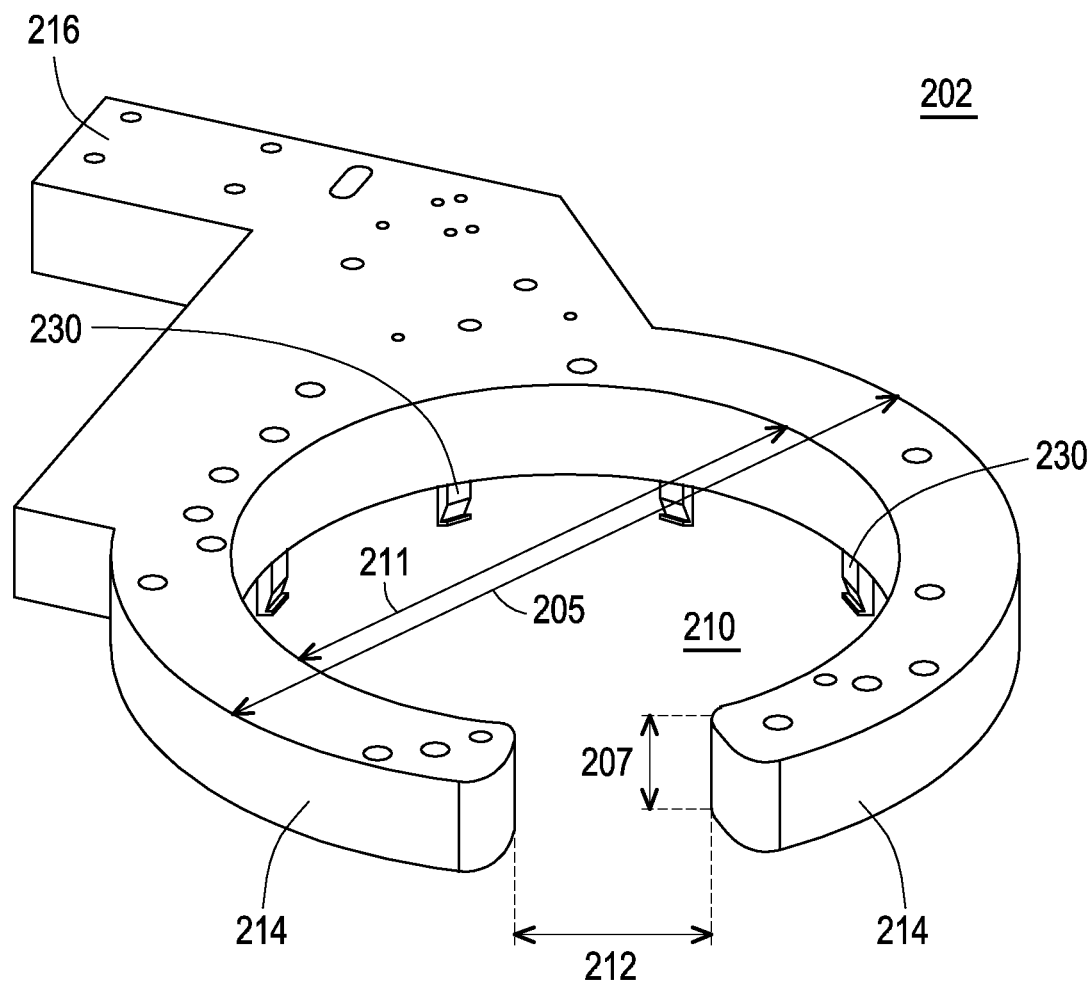
FIG. 5 is a perspective view of a base of the wafer gripper arm, in accordance with some embodiments.
Figure 6:
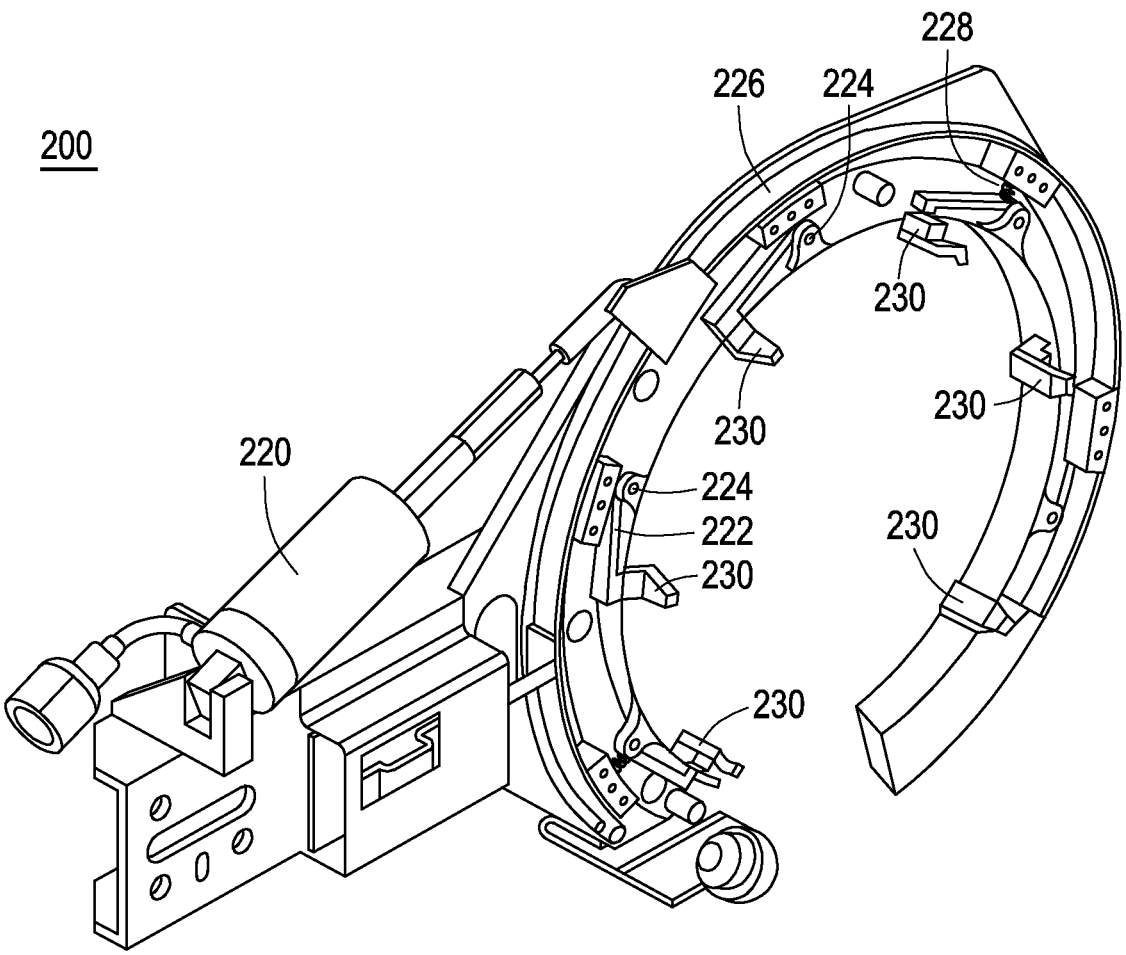
FIG. 6 is a bottom perspective view of the wafer gripper arm, in accordance with some embodiments.
Figure 7:
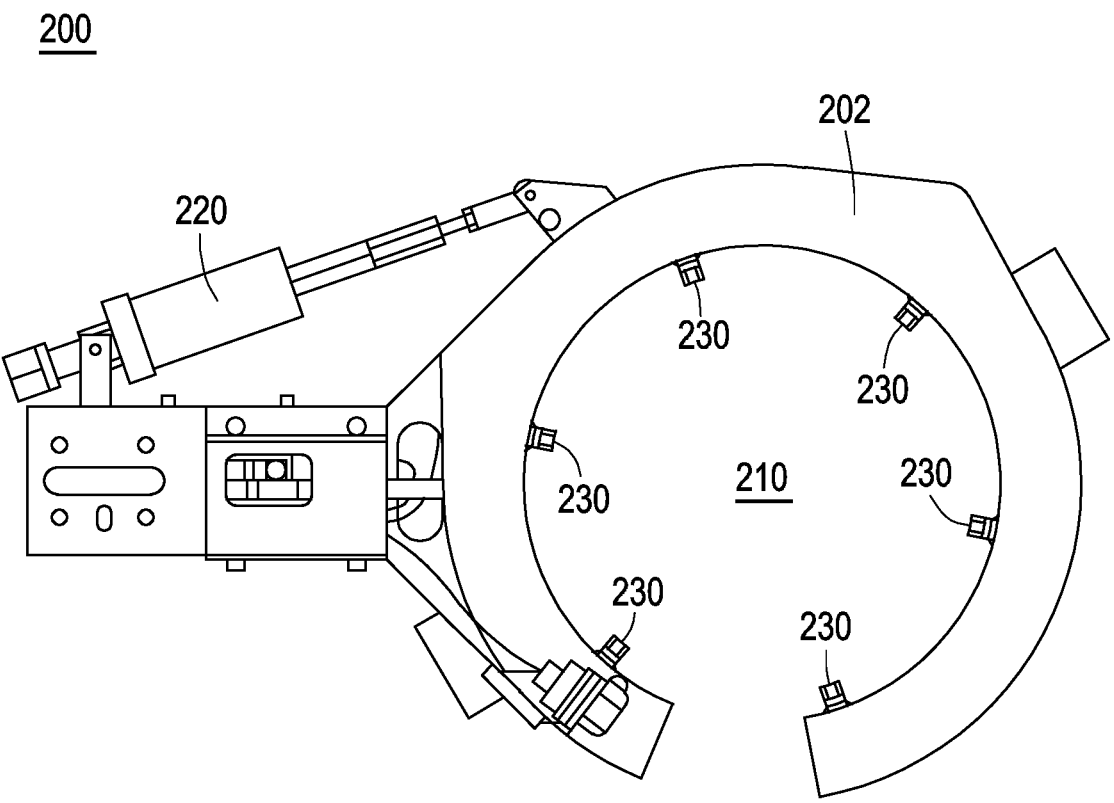
FIG. 7 is a plan view of the wafer gripper arm of FIG. 6.

The calibration jig is used to calibrate the fingers on a wafer gripper arm used in the process chamber of an ion implantation device. FIGS. 5-7 are different views of one embodiment of a wafer gripper arm. FIG. 5 is a perspective view of a base 202 of the wafer gripper arm. FIG. 6 is a bottom perspective view of the wafer gripper arm, with additional components attached to the base. FIG. 7 is a plan view of the wafer gripper arm.

Referring first to FIG. 5, the base 202 of the wafer gripper arm is a solid component that is shaped to surround a circular space 210 where the circular wafer will be gripped and supported by fingers 230. The inner diameter 211 of the circular space may be from about 150 mm to about 300 mm, depending again on the size of the wafer that is being handled by the wafer gripper arm. It is noted that the diameter 135 of the calibration plate 130 is less than the inner diameter 211.

An aperture 212 is present in the arm along the perimeter of the circular space. Put another way, the base is shaped to include two arcuate portions 214 whose ends are separated by the aperture 212. The outer diameter 205 of the base, which includes the two arcuate portions, may be from about 300 mm to about 400 mm. The height 207 of the base may be from about 15 mm to about 50 mm. A distal end of the base includes a flange 216 that is used to connect the wafer gripper arm to a joint (not shown) for moving the wafer gripper arm.

FIG. 6 shows the bottom of the wafer gripper arm 200, which includes the base with additional components attached. The gripper arm has a plurality of fingers 230, which are used for gripping the edge of a circular wafer. As illustrated here, the gripper arm has six circumferentially disposed fingers. Each finger is mounted on a support member 222, which is adapted to rotate about a pivot point 224 on the bottom of the base 202 of the gripper arm. A circumferential collar 226 surrounds all of the fingers 230. The collar is connected to each finger 230 by a spring 228 which connects the collar to the support member 222. The collar 226 is also engaged to a pneumatic cylinder 220. When the collar 226 is moved circumferentially by activating the pneumatic cylinder 220, each spring 228 will cause the support member 222 to pivot around its pivot point 224. Thus, all of the fingers 230 will move concurrently with the collar. Each finger will move radially inward to grip the wafer.

Additional measurement tools may be present on the wafer gripper arm as desired. For example, each finger or support member may include a strain gauge or other position-detecting sensor for detecting when the finger has contacted the wafer, and for controlling the force being applied to the wafer by the finger.

Referring to the plan view of FIG. 7, many of the moving parts visible in FIG. 6 are not visible here. However, the locations of the pneumatic cylinder 220 and the fingers 230 within the circular space 210 can be seen.

Figure 8A:
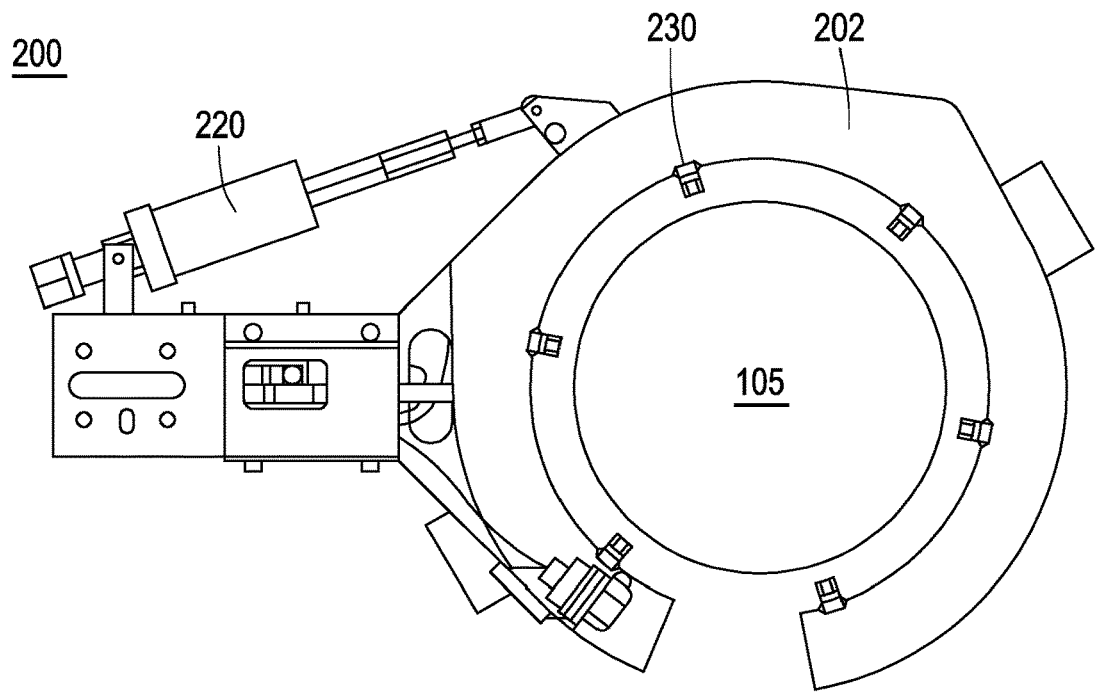
FIG. 8A is a bottom-plan view schematic diagram showing the operation of a calibrated wafer gripper arm.
Figure 8B:
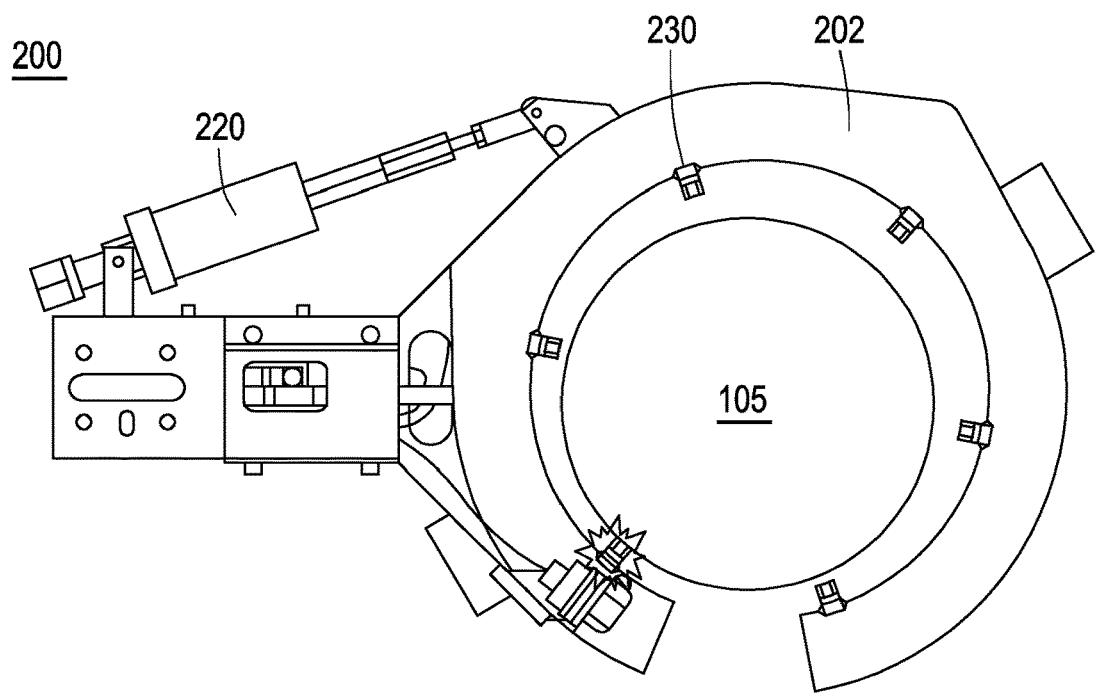
FIG. 8B is a bottom-plan view schematic diagram showing the operation of an un-calibrated wafer gripper arm.

FIG. 8A and FIG. 8B are bottom-plan view schematic diagrams illustrating the difference between operation of a calibrated wafer gripper arm and an un-calibrated wafer gripper arm. In both diagrams, the wafer gripper arm 200 is in an "open" position in which the fingers 230 should not be touching the wafer 105. In the diagram of FIG. 8A, the calibrated fingers 230 do not contact the wafer 105. However, in the diagram of FIG. 8B, one finger is not correctly calibrated, and as a result contacts the wafer 105 unexpectedly. Generally, all of the fingers should act in the same manner (either all of them contacting the wafer or none of them contacting the wafer), and improper calibration causes the fingers to act differently from the others in an unexpected manner.

Figure 9:
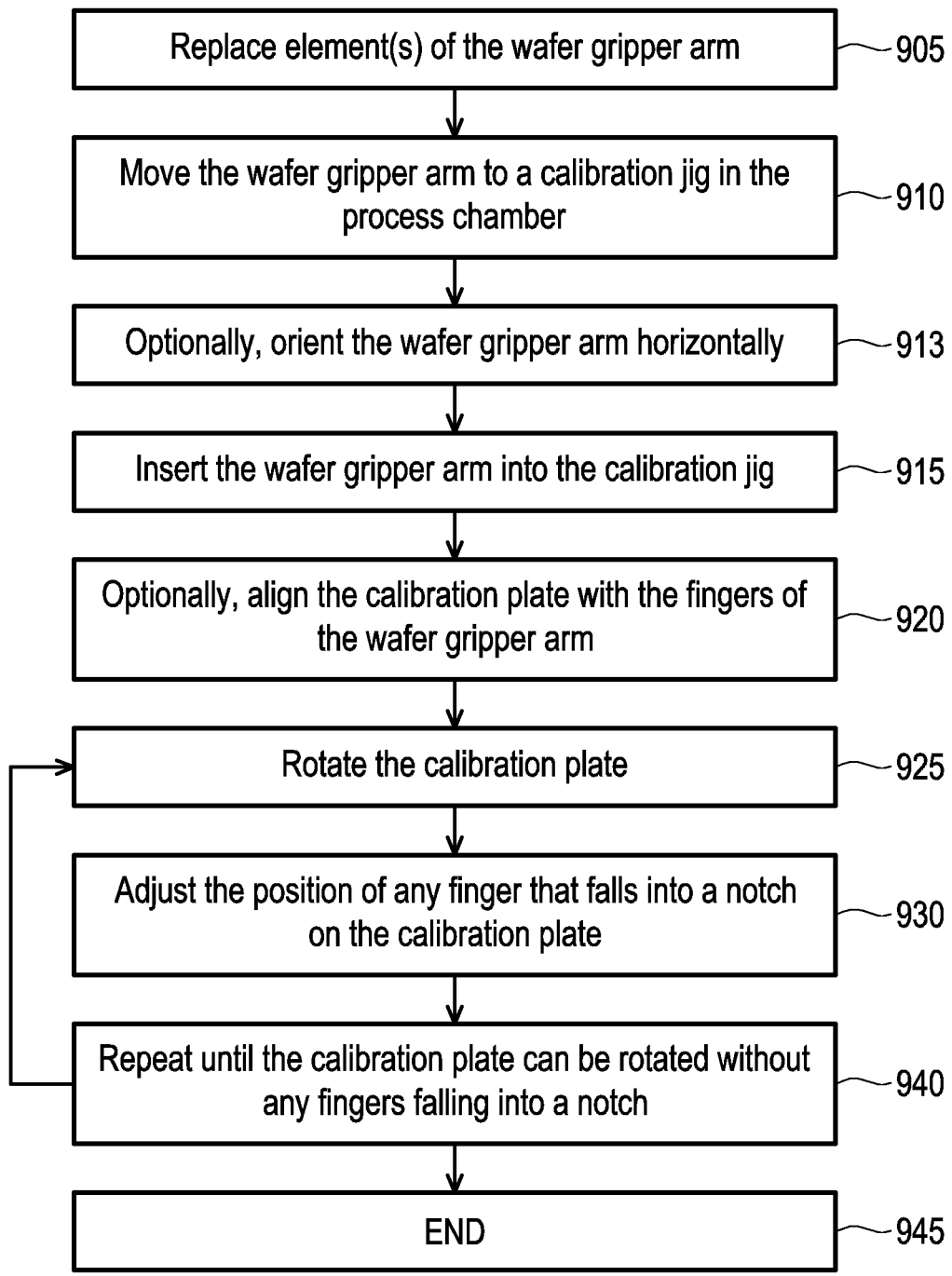
FIG. 9 is a flow chart illustrating a method for repairing and calibrating a wafer gripper arm of an ion implantation device, in accordance with some embodiments.

FIG. 9 is a flow chart illustrating a method 900 for repairing and calibrating a wafer gripper arm of an ion implantation device, in accordance with some embodiments. Some steps of the method are also illustrated in FIGS. 10A-11B.

Initially, it is assumed that the ion implantation device is not in operation. In step 905, one or more elements of the wafer gripper arm are replaced or fixed. For example, such elements may include the pneumatic cylinder 220, the circumferential collar 226, a support member 222, a spring 228, or a finger 230 previously described and illustrated in FIG. 6. This step is performed manually.

Next, in step 910, the wafer gripper arm is moved to the calibration jig. The calibration jig itself is located within the process chamber of the ion implantation device, as will be illustrated later. In optional step 913, the wafer gripper arm is oriented horizontally. Put another way, the two arcuate portions 214 of the wafer gripper arm are at the same height. In step 915, the wafer gripper arm is inserted into the calibration jig.

Figure 10A:
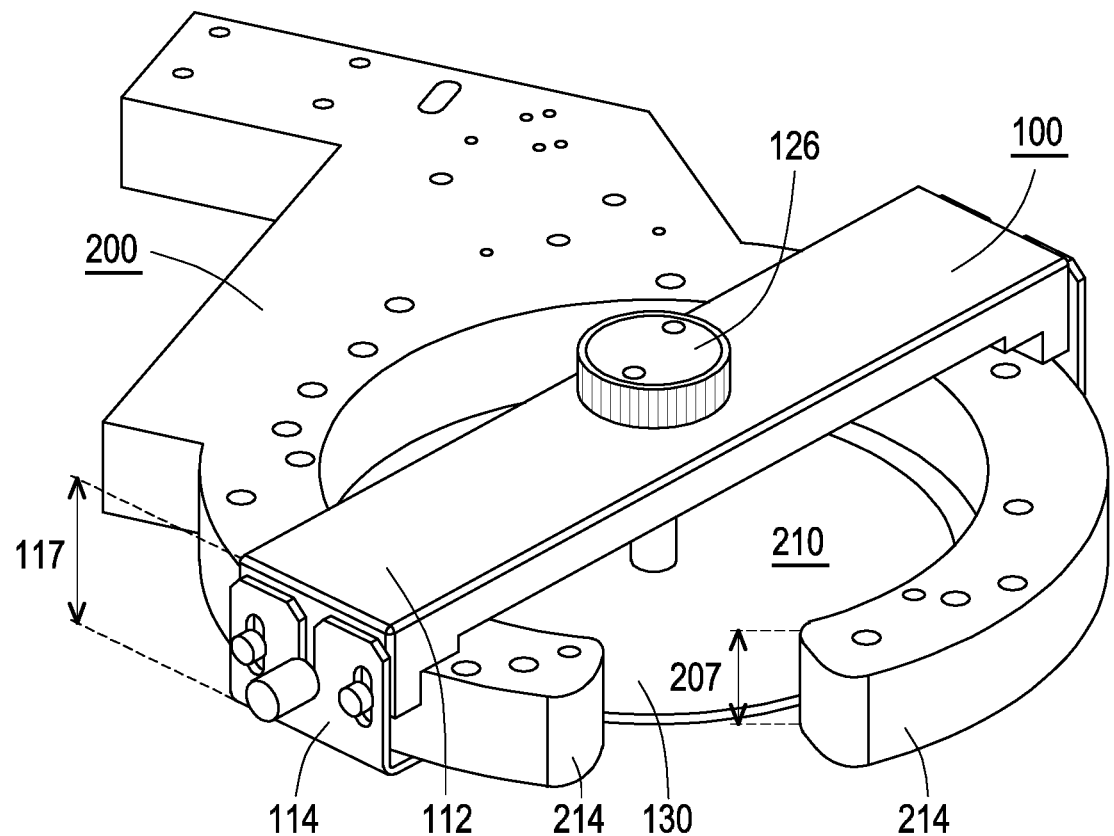
FIG. 10A is a perspective view of a wafer gripper arm inserted into the calibration jig.
Figure 10B:
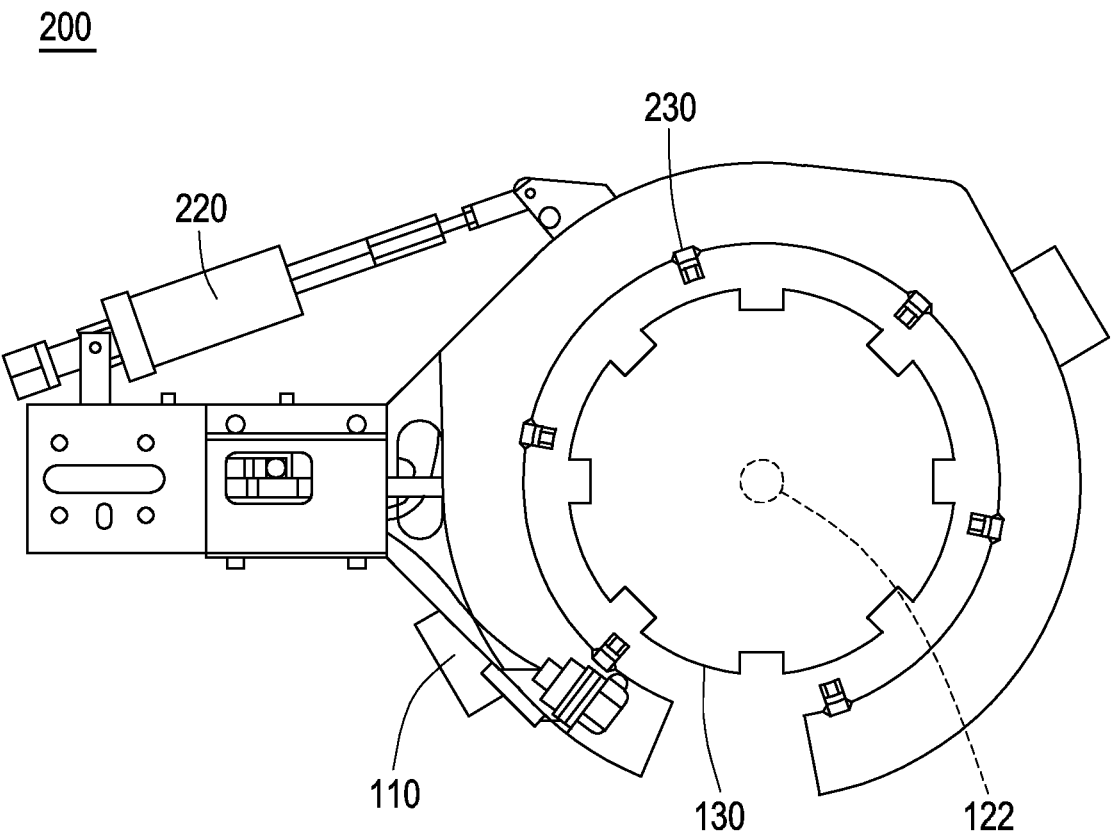
FIG. 10B is a bottom-plan view of the wafer gripper arm inserted into the calibration jig.

The result of step 915 is illustrated in FIG. 10A and FIG. 10B in partial view. As seen in FIG. 10A, the two arcuate portions 214 of the wafer gripper arm 200 are between the central beam 112 and the vertical hooks 114. Put another way, the height 117 of the mounting plate is greater than the height 207 of the base. The calibration plate 130 is within the circular space 210. It is noted that the calibration jig 100 is oriented horizontally, such that the calibration plate 130 is also oriented horizontally. Steps 910 and 915 can be performed by using a controller to move the wafer gripper arm, or can be performed manually by a person.

In optional step 920, the calibration plate is aligned with the fingers of the wafer gripper arm (see FIG. 10B). The calibration plate should be at the same height as the fingers, so that the fingers can engage the calibration plate. However, in particular embodiments, the size of the wafer gripper arm and thus the distance between the mounting plate and the calibration plate are known in advance, and so the distance between the mounting plate and the calibration plate is fixed.

Continuing, then in step 925, the calibration plate 130 is rotated. This can be done, for example, by spinning the knob 126. If a finger is not correctly adjusted, then the finger will fall into a notch in the calibration plate and the calibration plate will stop spinning or rotating.

Figure 11A:
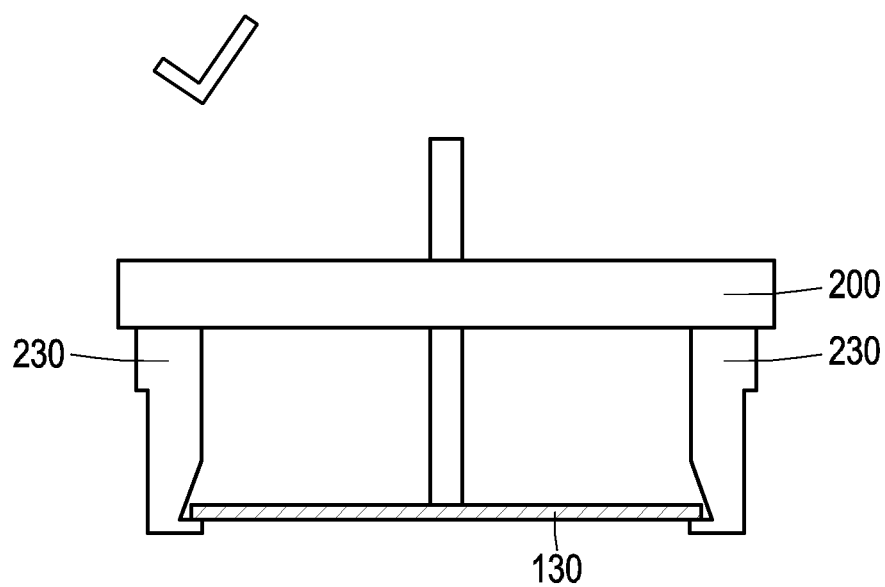
FIG. 11A is a side-view illustration of a properly calibrated wafer gripper arm interacting with the calibration plate of the calibration jig.
Figure 11B:
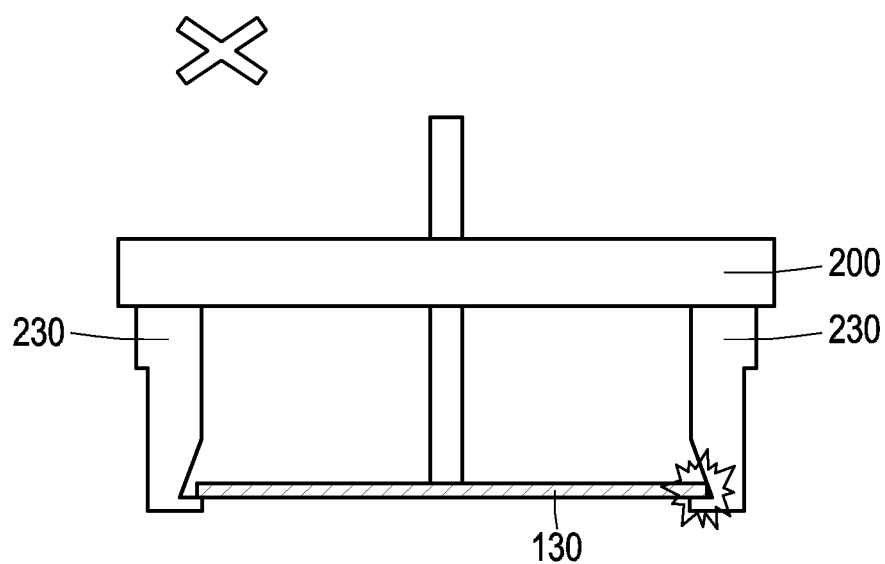
FIG. 11B is a side-view illustration of an improperly calibrated wafer gripper arm interacting with the calibration plate of the calibration jig.

This is illustrated in the side views of FIG. 11A and FIG. 11B. In these two views, the size of the fingers 230 of the gripper arm 2 are increased for ease of understanding. In FIG. 11A, when the fingers are correctly calibrated, then the calibration plate will continue to rotate, and will not be stopped by the fingers. In FIG. 11B, if a finger is not correctly calibrated, either in the horizontal or vertical directions, then some portion of the finger will fall into the notch and be contacted by one of the sides of the notch, as illustrated on the right-hand finger 230. This causes the calibration to stick, make a distinct sound, stop rotating, or provide some other sensory cue that the finger is not correctly adjusted. This can occur when a finger is too loose or too tight. If not calibrated, then wafer edge damage can occur, or the wafer can be dropped during transfer from one position to another.

It is noted that there is no correlation between the number of notches in the calibration plate 130 and the number of fingers 230 on the wafer gripper arm. For example, the calibration plate 130 can have one or more notches, and is illustrated as having eight notches. So long as the calibration plate can be rotated such that a notch passes past each finger, that is sufficient for the methods of the present disclosure.

In step 930, the position of any such finger which falls into a notch is adjusted to an acceptable location. The adjustment can be done, for example, by changing the position of the finger relative to the support member, or by changing the position of the support member around the pivot point, or by loosening or tightening the spring, etc. These adjustments can be made manually by the user.

In step 940, the calibration plate is rotated and the fingers are adjusted until the calibration plate can completely rotate without any fingers falling into a notch of the calibration plate. In step 945, the method ends. Steps 920-940 are also performed manually by a person.

Figure 12:
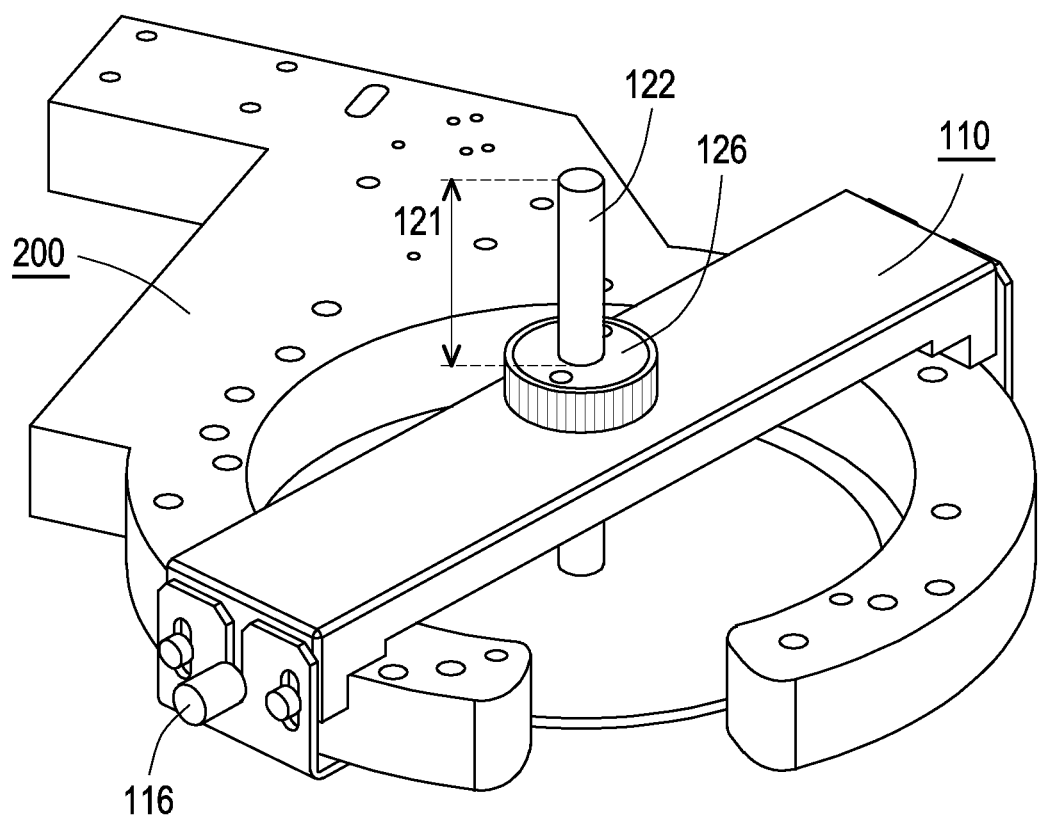
FIG. 12 is a perspective view of a wafer gripper arm inserted into a second embodiment of the calibration jig. Here, the support stand extends above the mounting plate and can also used to connect the calibration jig to the process chamber.

The calibration jig 100 is fixed in place within the process chamber of the ion implantation device. Referring now to FIG. 12, this can be done, for example, in one of two ways. First, as illustrated here, the shaft 122 also extends above the mounting plate 110. This portion of the shaft above the mounting plate may have a height 121 of about 300 mm to about 800 mm. In this embodiment, the fastener 126 may tighten radially, to fix the mounting plate 110 at a particular height along the shaft 122. The top end of the shaft can then be attached to a ceiling or top wall within the process chamber. Alternatively, one of the pegs 116 extending horizontally from the mounting plate can be attached to a side wall of the process chamber.

Figure 13:
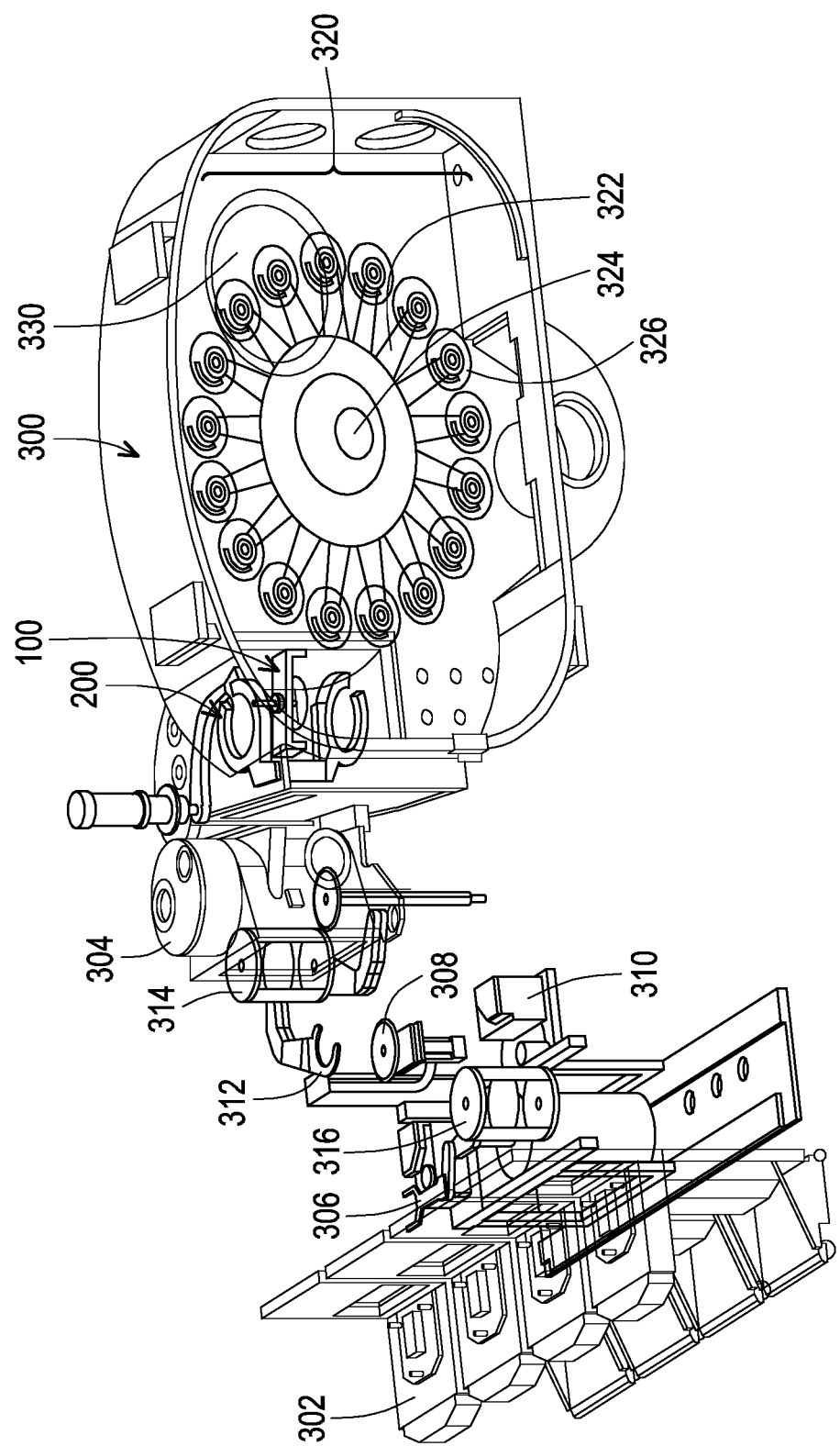
FIG. 13 is a perspective diagram illustrating a portion of one embodiment of the ion implantation device, showing the process chamber and system components for transferring wafers between atmospheric pressure and vacuum pressure within the process chamber.

FIG. 13 is a perspective diagram illustrating a portion of the ion implantation device, in accordance with some embodiments of the present disclosure. The process chamber 300 is shown, along with the surrounding apparatus used to transfer wafers between the atmospheric pressure outside of the process chamber and the vacuum pressure within the process chamber.

Starting on the left-hand side of FIG. 13, an Equipment Front End Module (EFEM) is a structure that is part of an automated material handling system (AMHS) for moving semiconductor wafer substrates between a wafer carrier and the process chamber. The EFEM takes the form of a four-sided housing that includes a filter fan unit (FFU) for providing a laminar gas flow to the interior environment of the housing. The floor of the EFEM is typically perforated, and the downward flow of air blows contaminants out of the interior and out of the EFEM. The front side of the housing includes one or more load ports to which a wafer carrier such as a Front Opening Unified Pod (FOUP), a Front Opening Shipping Box (FOSB), or a Standard Mechanical InterFace (SMIF) can be mounted. Four load ports 302 are illustrated here, and the remainder of the EFEM is not shown to expose the interior of the EFEM. The wafer carrier is not illustrated.

Continuing, a load-lock chamber 304 is located at an opposite side of the EFEM from the load ports 302. The load-lock chamber contains an internal volume which is gas-tight, and is capable of switching the internal pressure volume between a high pressure state and a low pressure state, thus permitting the vacuum environment within the process chamber to be maintained while also permitting the movement of wafers in and out of the process chamber.

One or more robotic carrier load/unload arms 306 are present within the EFEM, and are used to move wafers between a load port 302 and the load-lock chamber 304, whether to unload wafers from the load port or to place treated wafers back into a wafer carrier. The carrier load/unload arm 306 moves a wafer from a load port to a rotating elevator platform 308. Prior to entering the process chamber, each wafer typically includes a photoresist layer which forms a mask to expose only certain regions of the wafer and define where ions will be implanted.

A pre-aligner 310 is present. In this regard, a small notch is usually cut into the wafer substrate for alignment in a repeatable orientation during each processing step. The pre-aligner is used to identify the orientation of the wafer substrate, so the wafer substrate can be properly oriented in a known orientation. The elevator platform 308 then raises the wafer upwards to a cassette load/unload arm 312, which moves the wafer from the elevator platform to a wafer cassette 314, which can hold a plurality of wafers for the semi-continuous or batch ion implantation process. Also illustrated is a dummy wafer cassette 316, which can also be used to hold wafers in an intermediate position between loading/unloading to provide additional capacity.

Once the wafer cassette 314 is fully loaded, the wafer cassette 314 is moved into the load-lock chamber 304, which is pressurized at atmospheric pressure. The atmospheric-side gate into the load-lock chamber is closed. The load-lock chamber is then evacuated to reduce its pressure to the vacuum pressure that is present in the process chamber 300. The vacuum-side gate into the load-lock chamber is then opened.

Within the process chamber, a vertically oriented scanning wheel 320 is present. The scanning wheel 320 includes multiple wafer support structures 322 arranged in a circular array around a central hub 324. Each support structure 322 includes a wafer mounting surface 326 with conventional structures for holding a wafer in place. Two wafer gripper arms 200 are illustrated within the process chamber. Each wafer gripper arm is capable of moving between the horizontal orientation of the wafers in the wafer cassette 314 and the vertical orientation of the wafer support structures 322. Also illustrated is the calibration jig 100, which is fixed in place within the interior volume of the process chamber 300. The calibration jig is spaced away from the scanning wheel, and is proximate the wafer gripper arms and the load-lock chamber. Not shown here is a door that permits access to the interior volume of the process chamber, for example for repairing and maintaining the various elements within the process chamber.

When operated, the scanning wheel 320 rotates around the central hub 324 at high velocity past a window 330 through which an ion beam passes. This permits the batch of wafers mounted on the scanning wheel to be repeatedly passed through the ion beam to provide an even distribution of the ions over the wafer surfaces. Not shown in FIG. 13 are various systems which may be used to generate the vacuum, or generate or analyze the ion beam, or drive the scanning wheel, measure or control environmental variables within the process chamber, etc.

Figure 14:
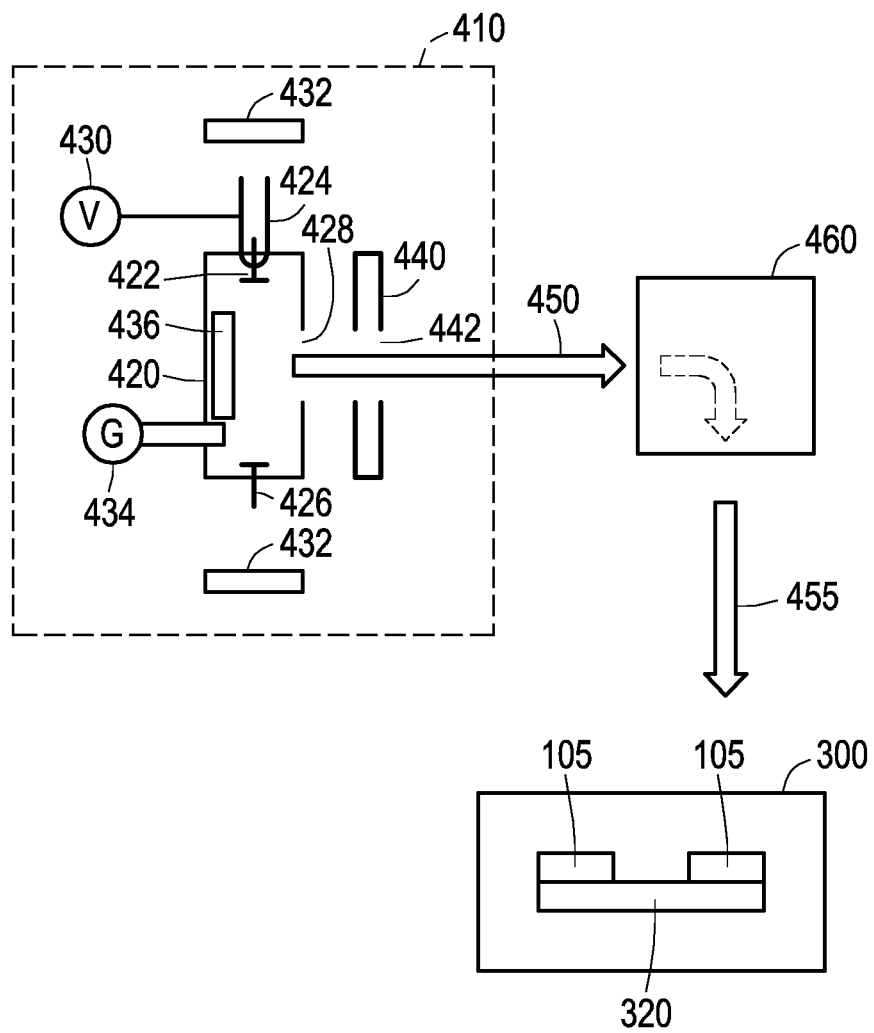
FIG. 14 is a schematic diagram of an ion implantation device or ion implanter, in accordance with some embodiments of the present disclosure.

FIG. 14 is a schematic diagram of an ion implantation device or ion implanter (not drawn to scale) 400, of which the process chamber 300 is a component thereof. As previously mentioned, ion implantation is generally performed in a vacuum environment. The ion implanter system includes an ion source 410. The ion source includes an arc chamber 420. One end of the arc chamber includes a cathode 422 with a metal filament 424 located therein, and an anode 426 is present at the opposite end of the arc chamber. The cathode and the filament may be made of any suitable materials, for example a refractory metal or alloy. In particular embodiments, such materials can include niobium, molybdenum, tantalum, tungsten, rhenium, and alloys and combinations thereof. In particular embodiments, the cathode and the filament comprise tungsten.

The metal filament is coupled to a first power supply 430 capable of supplying a high current. When heated by the current, the metal filament releases electrons. The cathode emits secondary electrons when the electrons from the filament hit the cathode. A source magnet 432 creates a magnetic field inside the arc chamber to confine the electrons. A gas source 434 supplies a dopant gas (e.g., $BF_3$ or $AsH_3$ or $GeF_4$ or $PH_3$) to the arc chamber. A high voltage is then applied across the cathode and the anode to produce a plasma. A biased extraction electrode 440 can then extract ions from the plasma through an exit aperture/slit 428 of the arc chamber. A repeller 436 at the other end of the arc chamber opposite the extraction electrode may be biased to repel the ions and send them through the exit slit. The extraction electrode itself includes a slit 442 through which the ion beam 450 passes.

The resulting ion beam 450 enters the beamline 460. The ion beam first passes through a mass analyzer where the beam is focused and bent through an angle, which can range for example from 70° to 90°. Electromagnetic fields can be used to change the radius of the bend and thus select the ion species that will exit the mass analyzer based on their mass to charge (m/e) ratio. Only the desired ions having the selected m/e ratio will exit the mass analyzer. Lighter ions will hit the inner wall of the bend, while heavier ions will hit the outer wall of the bend. A movable aperture or electromagnetic lens can be used to locate the exit in the appropriate location for the desired ions. In this way, only the desired ions are selected from the different ions that may originate from the ion source. The beam of selected ions is then accelerated to the desired energy. Other elements, such as lenses, electrodes, and filters may also be present in the beam line to produce the final desired ion beam 455. The ion beam 455 is then steered using electromagnetic fields to the process chamber 300. In the process chamber, wafers 105 are mounted on the scanning wheel 320. The ion beam 455 passes through the window to strike the exposed regions of each wafer substrate 105, so these ions can be implanted into the substrate as dopants at desired locations/depths. The substrate can be, for example, a wafer made of silicon, germanium arsenide (GaAs), or gallium nitride (GaN). In particular embodiments, ion implantation methods described in the present disclosure use silicon wafers as the substrate.

These dopants can enable the device or structure to have desired properties, which are essential for various applications. For example, source and drain regions of a semiconductor device are formed using dopants that have a different polarity from the substrate, and allow the semiconductor device to be turned on and off with a gate voltage. The source and drain regions can be formed by implanting ions in desired locations on the substrate. Common p-type dopants may include boron, gallium, or indium. Common n-type dopants may include phosphorus or arsenic.

The use of the calibration jig of the present disclosure improves the overall accuracy of wafer transfer. The wafer gripper arm can be calibrated without needing to remove it from the process chamber, reducing maintenance downtime and increasing process uptime. This is believed to improve wafer quality and reduce troubleshooting time by up to 70%.

In addition, prior calibration methods required the wafer gripper arm to be removed and affixed to an offline and vertically oriented jig. The actions of removing and reassembling the wafer gripper arm introduce additional steps where calibration can be lost. For example, removing/applying the various screws or collision of body parts with the wafer gripper arm during these steps can change the calibration. In addition, during calibration on the vertically oriented jig, the fingers hanging downwards at the top of the jig are pulled downwards by gravity and become "longer". In contrast, the fingers at the bottom of the vertically oriented jig become "shorter". This results in displacement deviation. Tolerances of 1 mm to 2 mm are required for the fingers, and the displacement deviation can fall outside these ranges. In the new horizontally oriented jig, the arm is also maintained in a horizontal orientation. As a result, the fingers are all equally affected by gravity, and the displacement deviation is removed.

Some embodiments of the present disclosure thus relate to methods for calibrating a wafer gripper arm of an ion implantation device. The wafer gripper arm is inserted into a horizontally oriented calibration jig that comprises: a mounting plate that spans a diameter of the wafer gripper arm; a support stand passing through the mounting plate; and a calibration plate at a bottom end of the support stand, a perimeter of the calibration plate including one or more notches. The calibration plate is rotated. Any finger of the wafer gripper arm that falls into the one or more notches is adjusted, until the calibration plate can be rotated without any fingers falling into a notch of the calibration plate.

Also disclosed in various embodiments are methods for repairing a wafer gripper arm of an ion implantation device. One or more elements of the wafer gripper arm are replaced. The wafer gripper arm is then moved within a process chamber of the ion implantation device to a horizontally oriented calibration jig. The calibration jig comprises a mounting plate that spans a diameter of the wafer gripper arm; a support stand passing through the mounting plate; and a calibration plate at a bottom end of the support stand, a perimeter of the calibration plate including one or more notches. The wafer gripper arm is inserted into the calibration jig, and the calibration plate is rotated. Any finger of the wafer gripper arm that falls into the one or more notches is adjusted, until the calibration plate can be rotated without any fingers falling into a notch of the calibration plate.

Also disclosed in various embodiments are ion implantation devices. The ion implantation devices include a process chamber and a load-lock chamber. The process chamber contains a vertically oriented scanning wheel with a plurality of wafer support structures. At least one wafer gripper arm is located within the process chamber for transferring wafers from the load-lock chamber to the wafer support structures of the scanning wheel. A horizontally oriented calibration jig is also present within the process chamber. The calibration jig comprises a mounting plate that spans a diameter of the wafer gripper arm; a support stand passing through the mounting plate; and a calibration plate at a bottom end of the support stand, a perimeter of the calibration plate including one or more notches.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for calibrating a wafer gripper arm of an ion implantation device, comprising:
    inserting the wafer gripper arm into a horizontally oriented calibration jig that comprises:
        a mounting plate that spans a diameter of the wafer gripper arm;
        a support stand passing through the mounting plate; and
        a calibration plate at a bottom end of the support stand, a perimeter of the calibration plate including one or more notches;
    rotating the calibration plate; and
    adjusting any finger of the wafer gripper arm that falls into the one or more notches until the calibration plate can be rotated without any fingers falling into a notch of the calibration plate.

2. The method of claim 1, wherein the calibration plate has a plurality of notches spaced around a perimeter of the calibration plate.

3. The method of claim 1, wherein the calibration plate is circular.

4. The method of claim 1, wherein each notch has a depth of about 1 millimeter to about 2 millimeters.

5. The method of claim 1, wherein each notch has a rectangular, elliptical, or polygonal shape.

6. The method of claim 1, wherein a diameter of the calibration plate is less than an inner diameter of the wafer gripper arm.

7. The method of claim 1, wherein the mounting plate includes vertical hooks at opposite ends thereof for holding the wafer gripper arm in place.

8. The method of claim 1, wherein the calibration plate is located about 30 mm to about 100 mm below the mounting plate.

9. The method of claim 1, further comprising orienting the wafer gripper arm horizontally prior to inserting the wafer gripper arm into the calibration jig.

10. The method of claim 1, wherein the calibration jig is located within a process chamber of the ion implantation device.

11. A method for repairing a wafer gripper arm of an ion implantation device, comprising:
    replacing one or more elements of the wafer gripper arm;
    moving the wafer gripper arm within a process chamber of the ion implantation device to a horizontally-oriented calibration jig that comprises:
        a mounting plate that spans a diameter of the wafer gripper arm;
        a support stand passing through the mounting plate; and
        a calibration plate at a bottom end of the support stand, a perimeter of the calibration plate including one or more notches;
    inserting the wafer gripper arm into the calibration jig;
    rotating the calibration plate; and adjusting any finger of the wafer gripper arm that falls into the one or more notches until the calibration plate can be rotated without any fingers falling into a notch of the calibration plate.

12. The method of claim 11, wherein the calibration plate has a plurality of notches spaced around a perimeter of the calibration plate.

13. The method of claim 11, wherein the calibration plate is circular.

14. The method of claim 11, wherein each notch has a depth of about 1 millimeter to about 2 millimeters.

15. The method of claim 11, wherein each notch has a rectangular, elliptical, or polygonal shape.

16. The method of claim 11, wherein the mounting plate includes vertical hooks at opposite ends thereof for holding the wafer gripper arm in place.

17. The method of claim 11, wherein the calibration plate is located about 30 mm to about 100 mm below the mounting plate.

18. An ion implantation device, comprising:
- a process chamber containing a vertically oriented scanning wheel with a plurality of wafer support structures;
- a load-lock chamber;
- at least one wafer gripper arm located within the process chamber for transferring wafers from the load-lock chamber to the wafer support structures of the scanning wheel; and
- a horizontally oriented calibration jig within the process chamber, the calibration jig comprising
  - a mounting plate that spans a diameter of the wafer gripper arm;
  - a support stand passing through the mounting plate; and
  - a calibration plate at a bottom end of the support stand, a perimeter of the calibration plate including one or more notches.

19. The method of claim 18, wherein the calibration plate has a plurality of notches spaced around a perimeter of the calibration plate.

20. The device of claim 18, wherein the calibration plate is located about 30 mm to about 100 mm below the mounting plate.

* * * * *